United States Patent [19]

Fletcher et al.

[11] 3,833,857

[45] Sept. 3, 1974

[54] MILLIMETER WAVE PUMPED PARAMETRIC AMPLIFIER

[76] Inventors: James C. Fletcher, Administrator of the National Aeronautics and Space Administration with respect to an invention of; Lawrence E. Dickens, Baltimore, Md.

[22] Filed: Oct. 2, 1973

[21] Appl. No.: 402,865

[52] U.S. Cl. .................................... 330/4.9, 330/53

[51] Int. Cl. .................................................. H03f 7/04

[58] Field of Search .......................... 307/88.3; 330/4.9

[56] References Cited

UNITED STATES PATENTS 3,105,941 10/1963 Kliphois .............................. 330/4.9

*Primary Examiner*—Herman Karl Saalbach
*Assistant Examiner*—Darwin R. Hostetter
*Attorney, Agent, or Firm*—Robert F. Kempf; John R. Manning; John H. Warden

[57] ABSTRACT

A millimeter wave parametric amplifier structure and varactor diode mounting structure therefor includes a housing within which is a pump frequency waveguiding channel and an intersecting signal frequency transmission line. The transmission line has a center conductor portion which protrudes into the pump channel. A portion of the housing forms the outer conductor of the transmission line. A pair of uncased varactor diode chips within the channel are stacked and connected in series across the wave guiding channel and are connected in parallel with respect to the inner and outer conductors of the signal transmission line. An adjustable stub means protrudes into the waveguiding channel adjacent the stacked varactor diode chips and defines a capacitive gap across the channel for series resonating the diode chips at an idler frequency. The stub means is located close to the stacked diode chips to provide a short return path for idler current generated by the diodes. The diodes, the stub means and the protruding portion of the center conductor are carried by a thin conducting wafer removably retained by the housing.

5 Claims, 3 Drawing Figures

MILLIMETER WAVE PUMPED PARAMETRIC AMPLIFIER

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 U.S.C. 2457).

FIELD OF THE INVENTION

The present invention relates generally to parametric amplifiers of the type employing a discrete varactor diode. In particular, the invention relates to a negative resistance parametric amplifier adapted for high frequency pump excitation in the millimeter wave range.

BACKGROUND OF THE INVENTION

The theory of operation of a parametric amplifier of the type wherein a high frequency pump voltage, typically applied via a waveguide, varies the capacitance of a varactor diode so that the diode presents a negative resistance to a lower microwave signal frequency is now well known. Input signal frequency power directed toward the pumped diode via a signal transmission line is reflected by the varactor diode back down the transmission line in amplified form. It is common to provide a circulator in cascade with the signal transmission line to provide separate ports for incident signal input and reflected amplified signal output. The amount of amplification due to the parametric amplifier is measured by the reflection coefficient due to the varactor diode which coefficient becomes quite large as the apparent negative resistance of the varactor diode is substantially matched in magnitude to the characteristic impedance of the signal transmission line.

It is well established that in order for this negative resistance to be presented, an idler current, generated in the amplification process, must flow from the diode with a frequency equal to the difference between the relatively high pump frequency and the relatively low signal frequency. In the prior art it has been taught by U.S. Pat. No. 3,443,233 to Kashkin et al., that the pump and signal frequencies should be selected so that the resultant idler frequency occurs at the substantially fixed parallel self-resonant frequency of the usual ceramic encased diodes which allows idler current to flow between the diode chip, within the diode case, and the case parasitic capacitance at a very high frequency.

This parallel self resonant frequency is approximately 35 gigahertz. Since the diode includes an inherent positive resistance (less than the magnitude of the apparent negative resistance) it has been recognized that the use of the highest possible idler frequency is the key to obtaining low noise and wide bandwidth. It has been further recognized that the only loss in the circuit for idler current should be the diode positive resistance.

The prior art further has provided a balanced configuration of encased diodes to achieve geometric isolation between pump and signal frequencies. U.S. Pat. No. 3,105,941 to Kliphuis is illustrative in this regard.

Because of the inherent diode positive resistance, it has generally become necessary to cryogenically cool wideband parametric amplifiers in order to minimize the introduction of noise by this resistance. This cooling has required expensive and cumbersome refrigeration devices. Furthermore, the pump frequency has been fixed by the idler self resonance which has limited flexibility in design. Of particular difficulty has been the necessity of changing and optimizing the pump frequency in existing high performance parametric amplifiers whenever varactor diodes are replaced and a slightly different idler self-resonant frequency is dictated.

SUMMARY OF THE INVENTION

A negative resistance parametric amplifier structure is provided by the present invention wherein two uncased varactor diodes are mounted in a balanced configuration within a demountable short section of pump waveguide. Adjustable tuning stub means projects into the waveguide section adjacent the uncased varactor diodes for completing a relatively short resonant path for idler current flow which includes a capacitive gap defined by the tuning stub means. By a balanced configuration, is meant that the varactor diode chips are stacked in series with opposed polarity across the pump waveguide in the direction of pump electric field and are effectively in parallel, with like polarity, across a signal transmission line which intersects the pump waveguide.

The varactor chips, which are preferably planar passivated Shottky barrier junctions, may be resonated by the tuning stub means over millimeter wave frequencies ranging from about 50–100 gigahertz. The achievement of these high idler frequencies is to a large extent due to the use of diodes which are not encased and consequently not limited by case parasitic capacitance. The provision of the adjustable tuning stub is also a key feature in the attainment of low noise without cryogenic cooling and the attainment of wide bandwidth. The provision of the adjustable tuning stub means permits the pump frequency to be fixed and the idler frequency to be tuned in accordance with the fixed pump frequency and the desired signal frequency.

The demountable short section of waveguide is a planar conducting wafer with a rectangular opening for the propagation of pump power which shall be described by considering the direction of pump electric field to be vertical. The planar wafer's opening is defined by top, bottom and side interior surfaces. An opening in the side of wafer communicates with the rectangular opening and the center conductor of a signal frequency transmission line protrudes horizontally through this side opening and into the rectangular opening. The varactor diode chips are stacked vertically by being affixed to lands on the top and bottom of the center conductor with either the anode side of both chips or the cathode side of both chips contacting the center conductor. A pair of elastically deformable whiskers, carried by the top and bottom wafer interior surfaces, project vertically into the rectangular opening and make spring-like contact with the other sides of the varactor diode chips.

Means are provided for removably retaining the wafer-like diode mount at the intersection of the pump waveguide and the signal transmission line whereby the diode mount may be easily replaced.

OBJECT OF THE PRESENT INVENTION

It is an object of the present invention to provide a new and improved parametric amplifier structure which exhibits a large gain-bandwidth product and low noise characteristics without cryogenic cooling being necessary.

It is a further object of the present invention to provide a new and improved parametric amplifier structure having an idler frequency higher than heretofore possible.

It is a further object of the present invention to provide a new and improved parametric amplifier structure having a resonant idler circuit which is easily adjustable in resonant frequency.

It is yet another object of the present invention to provide a new and improved diode mounting structure for a parametric amplifier which is removable retained by the parametric amplifier for easy replacement.

Other objects and features of the present invention will become apparent upon perusal of the following detailed description of one specific embodiment of the invention taken in conjunction with the appended drawing.

DETAILED DESCRIPTION OF THE DRAWING

Figures 1, 3:
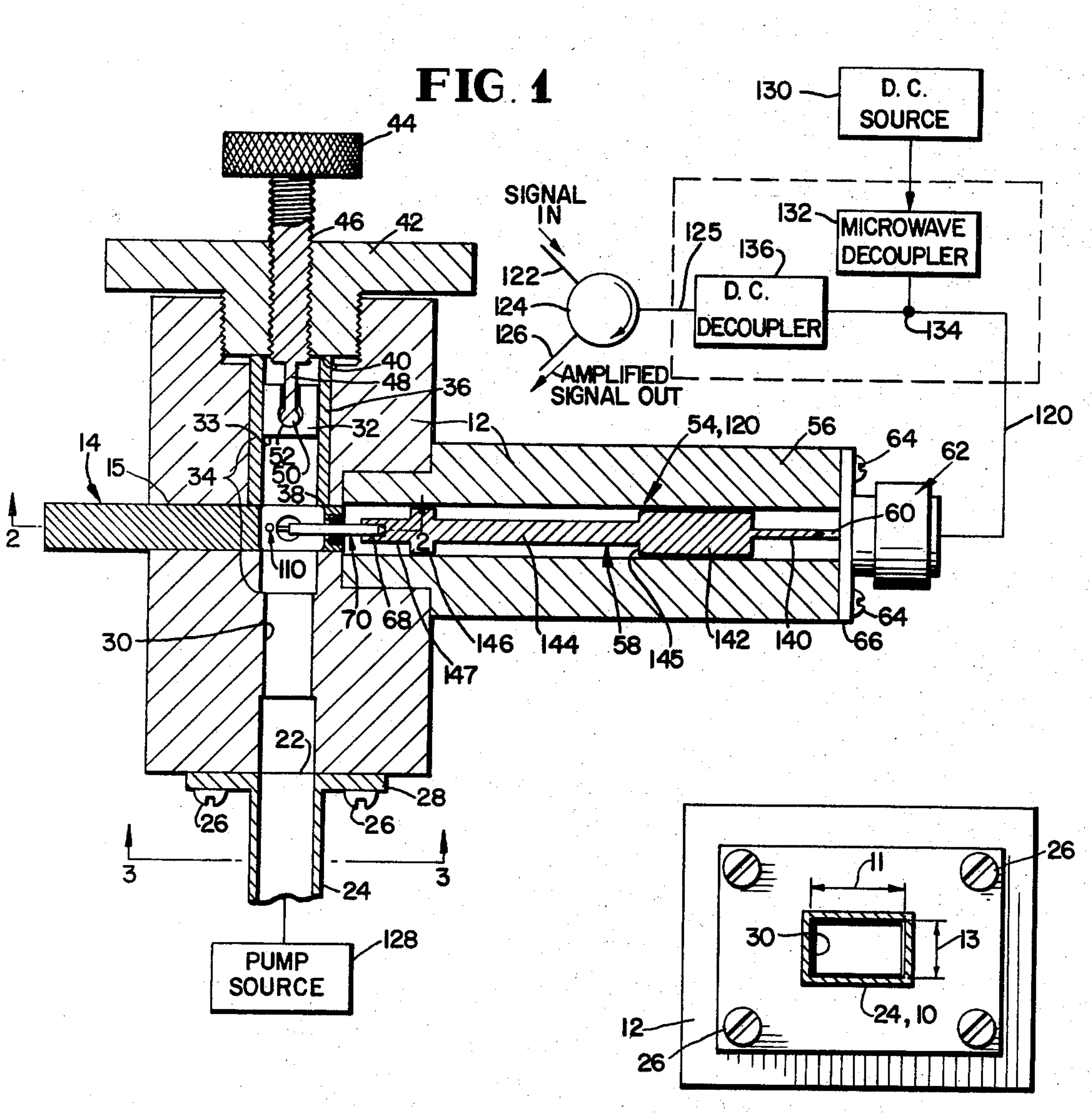
FIG. 1 is a cross-sectional plan view of the parametric amplifier structure of the present invention including a varactor diode mounting wafer. The parts, in addition to the structure, for a complete parametric amplifier are schematically shown.
FIG. 3 is a cross-sectional front view along the lines 3—3 of FIG. 1.
Figure 2:
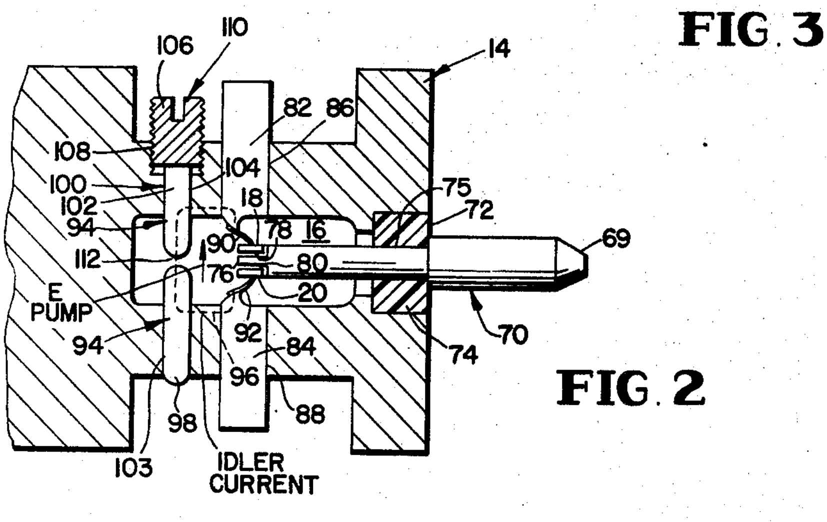
FIG. 2 is a front cross-sectional view of part of the varactor diode mounting wafer taken along the lines 2—2 in FIG. 1.

Referring to FIGS. 1 and 2, the negative resistance parametric amplifier of the invention will first be discussed to indicate the general relationship of pump frequency, signal frequency and idler frequency propagation paths, each of which includes a pair of varactor diodes 18 and 20. Microwave signal frequency power, as of several gigahertz, is propagated in the TEM mode in a two conductor transmission line 120. Input signal frequency power is fed to a first port 122 of a circulator 124 and emerges from circulator port 125. The signal travels down the two conductor transmission line 120 which terminates at the varactor diodes 18 and 20. The signal is reflected from the varactors in amplified form, due to the apparent negative resistance of the varactors, and travels up the transmission line 120, enters port 125 of circulator 124 and exits the circulator at a third port 126. High frequency pump power, as of 70 ghz, for varying the capacitance of the varactor diodes at the pump frequence is supplied from a pump frequency source 128 and propagates in the $TE_{01}$ in a waveguide 10 in which the diodes 18 and 20 are located.

Idler frequency current, necessary for the amplification process, flows in a closed path 96 substantially in the cross section of pump waveguide 10 (FIG. 2). Closed path 96 includes the varactor diodes and a variable capacitance element 112 within the pump waveguide 10 alongside the diodes.

The two conductor signal frequency transmission line 120 also conveys D.C. current from D.C. source 130 for biasing the varactors 18 and 20. The D.C. source is coupled to the transmission line 120 via a microwave blocking or decoupler element 132, such as a choke, at a point 134 intermediate the location of the varactor diode 18 and 20 and the circulator 124. A D.C. blocking element or decoupler 136 is connected between the circulator 124 and point 134 to isolate the input and output ports, 122 and 126, from the D.C. source.

Parametric amplifier structure 9 is the heart of the complete negative resistance parametric amplifier. Structure 9, the part of FIG. 1 shown in mechanical cross-sectional detail, contains the varactors 18 and 20, the idler current path 96 and portions of the signal frequency and pump frequency paths including the varactor diodes and microwave coupling and matching networks therefor.

Referring to FIGS. 1–3, the parametric amplifier structure 9 includes the hollow rectangular pump waveguiding channel 10 within a housing 12. The horizontal dimension 11 of channel 10 is larger than the vertical dimension 13 and the pump electric field, $E_{pump}$, derived from source 128 is in the vertical direction. A planar conducting wafer 14 has a rectangular opening 16, viewed perpendicular to the plane of the wafer, in which non-encased (or uncased) substantially identical, varactor diode chips 18 and 20 are mounted. The diode chips are preferably planar passivated Shottky barrier junctions. Wafer 14 is removably retained in transverse slot 15 in housing 12 with the rectangular opening 16 in registry with and forming a part of rectangular pump waveguiding channel 10.

Pump power, for varying the capacitance of the varactor diodes 18 and 20 at the pump frequency, is introduced at one end 22 of waveguiding channel 10 via a waveguide 24 which is attached in alignment with channel 10 by screws 26 passing through the waveguide flange 28 and threaded into housing 12. The pump power propagates down the waveguide channel 10 past a section 30 of reduced height, reduced width waveguide. Section 30, which is of a width less than half the idler wavelength, is a narrow bandpass filter for passing the pump frequency and for preventing any propagation of idler frequency power down the waveguide 10 toward channel end 22. The pump frequency power, after passing section 30, impinges on the varactor diode 18 and 20 within opening 16 in wafer 14. Behind wafer 14 the waveguide channel 10 is blocked by a sliding metallic stub 32, one face 33 of which defines a short circuited end wall of the channel. The volume between the face 33 and obstacle 30 forms a resonant cavity 34 in which the varactor diodes 18 and 20 are situated and wherein a standing wave is produced. End face 33 of sliding stub 32 is located so that the maximum electric field of this standing wave occurs substantially at the location of the varactor diodes to permit maximum transfer of pump power to the varactor diodes 18 and 20. The height and length of section 30 are chosen in a known manner to transform the impedance of the varactor diode loaded cavity 34 so that it matches the pump waveguide 24 characteristic impedance. Fine matching of the cavity 34 is accomplished by sliding the stub 32.

The portion 36 of waveguiding channel 10 at the back of wafer 14 where sliding stub 32 is located is slideable within housing 12. Portion 36 is a relatively thin walled rectangular metal pipe or sleeve having an exterior surface abutting against an interior bore of housing 12 and includes an end 38 that abuts the wafer 14 and frames the wafer rectangular opening 16. The other end 40 of sleeve 36 is urged downwardly by jam screw 42 which is threaded into the back of housing 12 coaxially with waveguide channel 10. The jam screw 42 urges sleeve 36 against the wafer 14, thereby holding the wafer in place in slot 15 and forces the wafer in good electrical contact with housing 12. Wafer 14 is easily removed by backing off jam screw 42 and sliding wafer 14 transversely out of slot 15. Sliding short adjustment knob 44 has a threaded shaft portion 46 which is coaxially threaded through jam screw 42. An extension 48 of threaded shaft portion 46 terminates in a ball 50 which is received by a socket 52 in the back of sliding stub 32. The ball 50 and socket 52 cooperate to form a bearing for translation of sliding stub 32 when adjustment knob 44 is rotated.

The signal frequency circuit comprises a two conductor transmission line 54 which perpendicularly intersects the pump waveguiding channel 10. Transmission line 54 carries incident signal power from the source feeding line 122 toward the varactors within the wafer 10 and reflected, amplified signal power away from the varactors back to circulator 124. The transmission line 54 is preferably a coaxial line comprising an outer conductor 56, which is a part of housing 12, and an inner conductor 58 that is coaxial with outer conductor 56. An input end of inner conductor 58 is supported by the center conductor portion 60 of a coaxial input connector 62 having an outer portion attached to an input end of outer conductor 56 by screws 64 passing through connector flange 66. The end of inner conductor 58 nearest varactors 18 and 20 has a short axial bore 68 for receiving a tapered end 69 of a center conductor portion 70 carried by the wafer 14. While transmission line 54 is shown as a coaxial line, it should be understood that other two conductor lines, such as a strip line, would suit the intended purpose. To provide signal frequency impedance matching between the transmission line 54 and the varactor diodes 18 and 20, inner or center conductor 58 is stepped to various diameters while the interior diameter of outer conductor 56 is constant. Center conductor 58 includes a portion 140, connected to connector center conductor 60 which is of a first diameter for providing a 50 ohm transmission line. Moving toward the varactor diodes, the center conductor is stepped to an increased diameter over a quarter wavelength portion 142, which is an impedance transformer for matching the apparent negative resistance of the diodes 18 and 20 at end 145 of portion 142 nearest the diodes. Then a half wavelength long portion 144, which is of a smaller diameter than portion 142, functions as a series resonator. Next, a short increased diameter portion 146 of center conductor 58 provides a shunt capacitance for parallel resonating the varactor diodes 18 and 20 which are connected to portion 146 via a short section 147 which has a bore 68 for receiving by the inductive short center portion 70. The two signal frequency resonant circuits, one involving the diodes 18 and 20, the series inductive portion 70 and the shunt capacitance 146 and the other including the series resonator 144 provide means for double tuning the signal circuit for obtaining a wideband amplifier characteristic.

To couple signal energy from the transmission line 54 to varactor diodes 20 in wafer 14, the wafer has, in alignment with center conductor 58, a side opening 72 which communicates with rectangular opening 16. An insulating ring 74 is adhesively secured in opening 72 and has a bore 75 through which center conductor portion 70 is horizontally inserted into the wafer rectangular opening 16. The other end 76 of center conductor portion 70 is preferably located approximately in the center of rectangular opening 16.

Diodes 18 and 20 are electrically connected in a balanced configuration for geometrically isolating the signal circuit, at the top and bottom of center conductor end 76 on two flat steps or lands 78 and 80. Keying may be employed between the center conductor portion 70 and insulator 74 to aid in maintaining these lands horizontal during assembly of the wafer diode mount 14. Either the anodes of both diode chips or the cathodes of both diode chips are affixed to lands 78 and 80 to achieve the proper balanced configuration. The diodes are thus stacked vertically across rectangular opening 16 and are in series with opposed diode polarity across the pump electric field.

Conductive whiskers 90 and 92 for diodes 18 and 20 are conductively secured to rods 82 and 84 that are force fitted into vertically oriented top and bottom holes 86 and 88 of housing 14. Whiskers 90 and 92 are elastically deformed to make spring-like contact with the outer, horizontal faces of diode chips 18 and 20. Since the wafer 14 is in electrical contact with housing 12 of which coaxial outer conductor 56 is a part, the signal transmission line continues to the end 76 of center conductor portion 70. At that point the diode chips, each connected between the wafer and the center conductor portion, are in parallel and of like polarity across the signal transmission line.

Mounted horizontally alongside varactor diodes 18 and 20 in rectangular opening 16 is an adjustable tuning stub means 94 for completing a very short resonant path 96 for the idler current produced by the diodes. Stub means 94 comprises a fixed vertical rod or stub 98 which protrudes into opening 16 from the bottom of wafer 14 and an adjustable rod or stub 100 which protrudes from the top of wafer 14 in vertical alignment with the fixed stub. Fixed stub 98 is force fitted through bore 103 communicating from the bottom side of wafer 14 to the rectangular opening 16. Adjustable stub 100 has a shaft portion 102 which protrudes into rectangular opening 16 through bore 104 in the top of wafer 14. The top portion 106 of stub 100 is threaded in a bore 108 in wafer 14 which is larger than and coaxial with bore 104. The top end of stub 100 has a screw driver slot 110 for adjusting the protrusion of adjustable stub 100 into rectangular opening 16. By varying the protrusion of stub 100, the capacitive gap 112 across the rectangular opening 16 between the vertically aligned fixed and adjustable stubs is varied. The capacitive gap 112, the two varactor diode chips 18 and 20, and the whiskers 90 and 92 (which are primarily inductive elements) are all effectively in a closed series circuit indicated by the contour 96. The gap 112 capacitance is varied to resonate the varactors diode chips.

In practice, it has been found that varactor diode chips of the planar passivated Shottky barrier type can be resonated in this general mounting configuration at frequencies ranging from 50 to 100 gigahertz. Because of the extremely high range of idler frequencies obtainable, the pump frequency can be in the millimeter range to yield a large gain bandwidth product and low noise performance at room temperature.

In a design of a parametric amplifier for a particular signal frequency it is only necessary to first select the pump frequency and then choose the stub diameter, and/or the conducting whisker length to generally approximate resonance at the resultant idler frequency. Adjustment of the variable stub 100 finely resonates the idler circuit.

An amplifier embodying the invention has been built and the following characteristics indicate the advancement of state of the art performance obtained therefrom at room temperature:

| | | |
|---|---|---|
| Signal center frequency | 07.6 | Gigahertz |
| Idler center frequency | 62.4 | Gigahertz |
| Pump frequency | 70.0 | Gigahertz |
| Gain | 15.0 | db |
| Gain ripple | <02.0 | db |
| Signal bandwidth (3db) | 500.0 | Megahertz |
| Noise temperature | 63.0° | Kelvin |
| Pump power | <30.0 | milliwatts |
| Dynamic Range (Input signal for 1 db gain compression) | −45.0 | dbm |

Obviously, this invention is not limited to the specific embodiment shown in the drawing and described in the specification, but it is capable of numerous other modifications and changes without departing from the spirit and scope thereof. Said invention should be limited by the scope of the appended claims.

What is claimed is:

1. A parametric amplifier structure characterized by signal, pump, and idler frequencies comprising:

a housing:

a pump frequency waveguiding channel within said housing, wherein the channel is adapted to carry pump frequency radiant energy having an electric field in a predetermined direction;

a signal frequency transmission line including an outer conductor forming a part of said housing and an inner conductor within the outer conductor wherein the inner conductor includes a portion which protrudes into the waveguiding channel;

a stacked pair of uncased varactor diode chips within the waveguiding channel wherein the diodes are stacked in the predetermined direction;

means for connecting the stacked varactor diode chips in series across the pump waveguiding channel;

means including the protruding portion of the inner conductor for connecting the pair of varactor diode chips in parallel across the inner and outer conductors of the signal transmission line; and stub means, connected to the housing and protruding in the predetermined direction into the waveguiding channel adjacent the stacked varactor diode chips, defining a capacitive gap for series resonating the varactor diode chips at the idler frequency.

2. The structure of claim 1 in combination with a planar conducting wafer, removably carried by the housing, wherein the wafer has an opening in the plane of the wafer, said opening forming a part of the pump waveguiding channel, and wherein the stacked varactor diodes, the stub means and the protruding portion of the inner conductor are carried by the wafer.

3. The structure of claim 2 wherein the stub means is carried by the wafer in a manner where the amount of stub means protrusion into the waveguiding channel, and consequently the capacitive gap defined by the stub means, is adjustable.

4. A varactor diode mounting structure for a parametric amplifier characterized by signal, pump, and idler frequency propagation comprising:

a relatively thin planar conducting wafer having a rectangular opening for pump frequency propagation viewed perpendicular to the plane of wafer, defined by top, bottom, and side surfaces, and a side opening for signal frequency propagation, said side opening being viewed in the plane thickness of the wafer wherein the side opening joins the rectangular opening;

a signal frequency conductor passing through the side opening and protruding into the rectangular opening;

a pair of uncased varactor diode chips within the rectangular opening, wherein the diode chips are stacked in a balanced configuration with respect to the rectangular opening and the signal frequency conductor for geometrically isolating pump and signal frequency propagation, and adjustable stub means protruding into the rectangular opening alongside the stacked varactor diodes, said stub means defining a capacitive gap for series resonating the stacked varactor diode at the idler frequency.

5. The structure of claim 4 wherein the signal frequency conductor has two opposed lands, respectively facing the top and bottom surfaces of the rectangular opening, one of the varactor diode chips being seated on each of the lands, a first whisker connecting one diode to the top surface and a second whisker connecting the other diode to the bottom surface.

* * * * *